HYBRID THERMOELECTRIC GENERATOR

Filed April 1, 1968

INVENTOR
LEROY J. CAPRAROLA

BY Edward J. Norton
ATTORNEY

United States Patent Office 3,674,568

Patented July 4, 1972

3,674,568

HYBRID THERMOELECTRIC GENERATOR

Leroy J. Caprarola, Morristown, N.J., assignor to RCA Corporation

Filed Apr. 1, 1968, Ser. No. 717,526
Int. Cl. H01v *1/02*
U.S. Cl. 136—205 4 Claims

ABSTRACT OF THE DISCLOSURE

A cylindrical thermoelectric generator having two concentric thermoelectric elements is disclosed. The outer element is used together with the heat receiving and heat rejecting means and appropriate bonding and stress aleviation members, to hermetically seal under compression the inner element from the environment surrounding the generator.

BACKGROUND OF INVENTION

Figure 1:
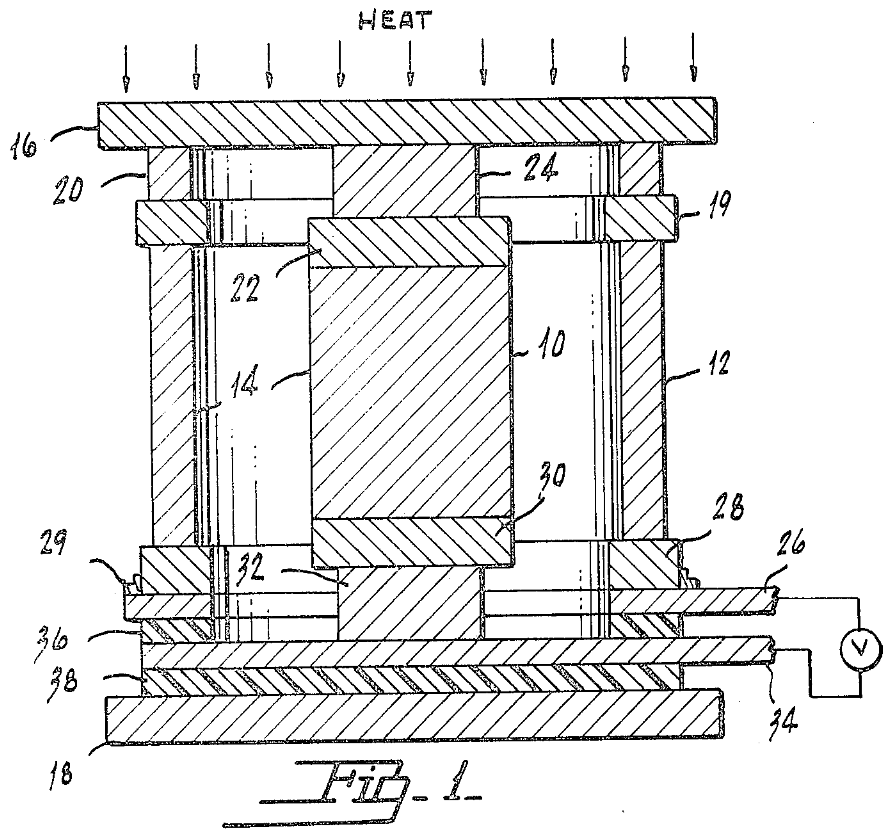

This invention relates to thermoelectric couples and more particularly to a thermoelectric couple having two active semiconductor thermoelements, one being P-type and the other being N-type, where one of the thermoelements is used as part of the means for hermetically sealing and protecting the other from the surrounding environment.

When two dissimilar thermoelectric elements (hereinafter called thermoelements) are thermally joined to form a loop, and the two junctions forming the loop are kept at different temperatures, a certain electrical power is produced due to what is known as the Seebeck effect. The efficiency of this device (hereinafter called a thermocouple) is directly proportional to the difference in temperature between the hot junction and the cold junction. When used herein, hot junction will mean the junction to which heat is applied and cold junction will mean the junction from which heat is transferred into the environment surrounding the thermocouple.

It has further been found that where the thermoelements are semi-conductive materials, appropriately doped with either P-type or N-type impurities, a higher efficiency is obtained than in a system where purely metallic elements are used. The efficiency is given approximately by the formula, $$M \approx \frac{1}{4}(Z)(\Delta T)$$

where Z is the figure of merit of the material used and $\Delta T$ is the temperature difference between the hot and cold junctions. Every type of material has a different figure of merit and, in fact, a P-type and an N-type of the same host material may have widely differing figures of merit.

It has further been found that by using one thermoelement of a P-type semiconductor and another thermoelement of an N-type semiconductor, a greater power may be obtained. From this it may appear that all that is necessary for a good thermoelectric generator is to find the P-type semiconductor with the highest figure of merit and the N-type semiconductor with the highest figure of merit, and combine the two into a thermocouple. However, certain important physical properties of thermoelectric materials which must be taken into consideration, especially at high temperatures, make the problem far more complex.

At high temperatures, certain materials tend to sublime, become inefficient, or not offer long-term stability. A further problem is that certain materials are difficult to metallurgically bond to other members in the device. Another problem is that certain materials do not have high tensile strength, and hence the thermocouple cannot be used for many desirable purposes.

Various solutions to these problems individually exist although no solution, other than the one taught herein, can utilize the advantages of certain material and construction techniques to overcome the disadvantages of others.

It has been found that the problem of low tensile strength can be overcome by placing a thermoelement of the low tensile strength material under a certain built-in compression. When the thermoelement is under compression it is further unnecessary to use strong metallurgical bonds between the thermoelement and other members of the thermocouple.

The tendency of certain materials to breakdown at high temperatures has been eliminated by segmenting the material at the hot end with another material of the same polarity which doesn't breakdown at the high operating temperature. This technique may also be used for those materials which exhibit a high figure of merit at low temperatures but a low one at high temperatures.

The problem of sublimation is corrected by hermetically sealing the material in an environment of an inert gas. However, in the past, the means used for hermetically sealing the thermoelement utilized a non-semiconductive material, such as stainless steel, which further acted as the second thermoelement. This added weight and complexity to the system without an equivalent amount of added efficiency. It further shunted heat from the semiconductive thermoelement, and thus reduced power output and efficiency.

Through the use of this invention, it is possible to utilize the procedures for overcoming the problems of low tensile strength, difficult bonding, breakdown, sublimation and figure of merit selection without having to hermetically seal the material in a non-semiconductor material.

Therefore an object of this invention is to provide an improved thermocouple.

Another object is to provide a lighter and more powerful and efficient thermocouple.

Yet another object is to provide a thermocouple in which the problems of low tensile strength and difficult bonding of materials is overcome.

These objects are realized by using a doped semiconductive material as one thermoelement, where the material has a high stability and figure of merit, is insensitive to its environment, is easily bondable, and possesses high tensile strength, and by further using this same thermoelement as part of the apparatus for hermetically sealing a second thermoelement under compression where the material of the second thermoelement does not possess some of the above-mentioned desirable characteristics.

Figure 2:
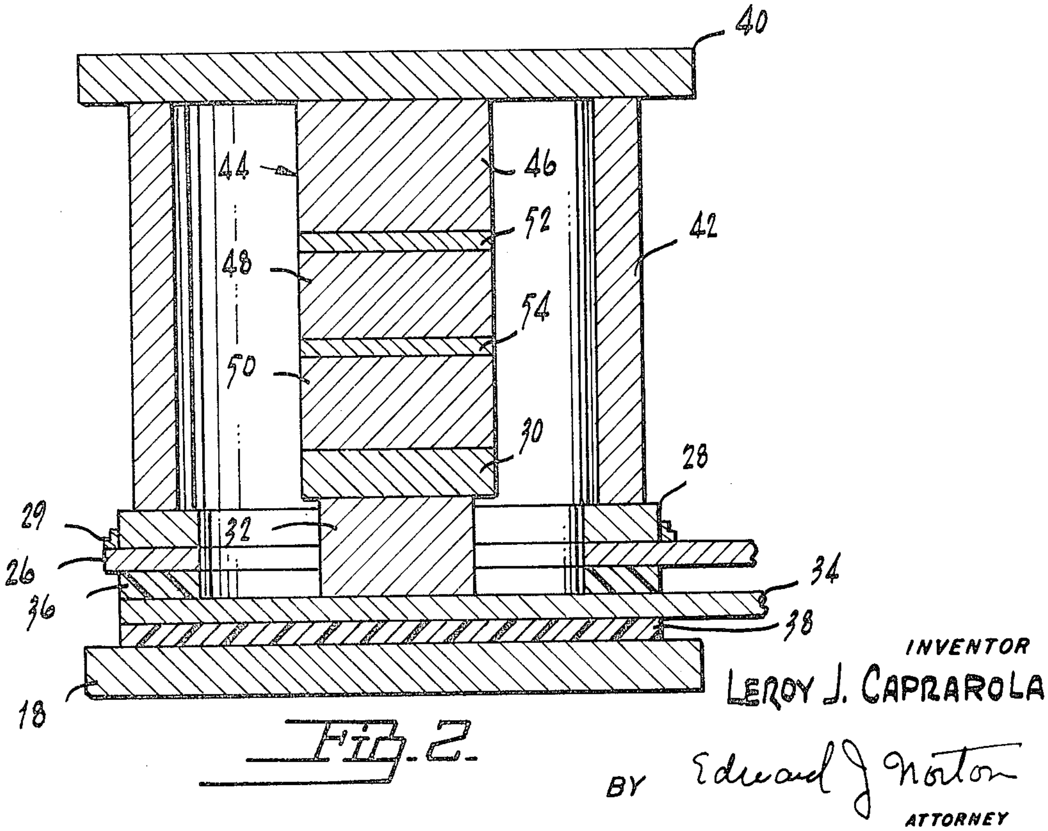

The objects and novel features of the invention will become apparent when taken in connection with the two figures, the detailed description and appended claims wherein:

FIG. 1 shows a cut away view taken across the diameter of a first embodiment of a cylindrical thermocouple having two concentric cylindrical thermoelements, and FIG. 2 shows a second embodiment of the same type of thermocouple.

In FIG. 1, a cylindrical thermocouple is constructed with solid cylindrical inner thermoelement 10 and hollow cylindrical outer thermoelement 12. The inner wall of thermoelement 12 has a larger diameter than the outer wall of thermoelement 10. Therefore, when thermoelement 10 is placed concentrically inside thermoelement 12, gap 14 exists. Thermoelement 12, together with heat reception member 16, heat rejection member 18 and associated bonding and stress alleviation members, insulators and terminals, which will be hereinafter explained in more detail, will hermetically seal thermoelement 10 under a compression from the environment in which the thermocouple operates.

The choice of the thermoelectric materials for thermoelements 10 and 12 is based on several considerations. The host material of thermoelement 12 must be capable of unprotected operation in a variety of environments, such as air, vacuum, or combustibles. It should possess high tensile strength and be easily bondable to other materials by metallurgical methods.

Thermoelement 10 need not possess any of the above features. Since it is hermetically sealed from the thermocouple's environment, its operation is independent of the environment in which the thermocouple operates. Because thermoelement 10 is under compression, its tensile strength becomes a minor factor and it can be contacted to other materials due to this compression alone, if necessary, or it may be metallurgically bonded.

The materials of both thermoelements 10, 12 must possess high figures of merit and exhibit stable operation at high temperatures. As will be explained in more detail hereinafter, it is possible to segment the thermoelements 10 and 12 with other materials at the hot and cold ends to achieve a maximum figure of merit and stability of operation.

By way of example, P-type silicon-germanium can be used for thermoelement 12 and N-type lead telluride can be used for thermoelement 10. P-type silicon germanium has high tensile strength, is easily bondable by metallurgical methods, is insensitive to operating environments, operates well at high temperature, and has a high figure of merit. N-type lead telluride has a high figure of merit.

At its hot junction, thermoelement 12 is coupled to heat reception plate 16 through bonding member 19 and stress alleviation member 20, each of which are thermal and electrical conductors. The material of member 19 may be tungsten and the material of member 20 may be gold. Thermoelement 10 at its hot junction is coupled to heat reception plate 16 through bonding member 22 and stress alleviation member 24, both of which are electrical and thermal conductors. Member 22 may be iron and member 24 may be gold. Heat reception plate 16 is also a thermal and electrical conductor such as tungsten. Hence an electrical path exists at the hot junctions between thermoelement 10 and thermoelement 12 for electrons, and thus current, to flow due to the Seebeck effect.

At the cold junction, thermoelement 12 is coupled to terminal 26 through bonding member 28. The material of bonding member 28 may be tungsten, and terminal 26 can be made of nickel plated copper. In order to insure continuity of contact and to obtain hermetic sealing, a moveable L-shaped circular brazing collar 29 of nickel plated copper snugly fits around bonding member 28 and is placed in intimate contact with the top of terminal 26. The cold junction of thermoelement 10 is coupled through bonding member 30 and stress alleviation member 32 to terminal 34. Member 30 may be iron and member 32 gold. Terminals 26 and 34 are electrically, but not thermally, separated by insulator 36 which may be $Al_2O_3$. Terminal 34 is thermally, but not electrically, coupled at heat rejection plate 18 through insulator 38, which may be $Al_2O_3$.

Since terminals 26 and 38 are not electrically coupled, a voltage exists between them. When these terminals are coupled together through a load, electrical power is derived from the thermocouple.

Heat may be supplied to heat reception plate 16 from the sun, by radiation from a radioisotope fuel capsule or from the mandril of a fossil fuel burner.

Stress alleviation members 24 and 32 and bonding members 22 and 30 and thermoelements 10 and 12 should be of such dimensions that thermoelement 10 is put under a slight compression.

In applications where such is desired, an inert gas, for example, 95 percent argon and 5 percent hydrogen, can be backfilled into gap area 14 between thermoelements 10 and 12. While not shown, a suitable, sealable tubulation can be provided through the heat rejection member 18, insulator 38, terminal 34 and stress alleviation member 32 to provide access to the gap area 14 for the insertion of the inert gas.

In FIG. 2, a second embodiment is shown for use where very large temperature differences are necessary such as 1000° C. at the hot junction and 100° C. at the cold junction.

Heat reception member 40 is directly bonded to P-type silicon germanium thermoelement 42. Member 40 in this embodiment is a semiconductor material with good electric and thermal conducting properties such as silicon molybdenum, which is highly doped with P-type impurities. Member 40 may be directly coupled to inner thermoelement 44, as shown in FIG. 2, or may be coupled through stress alleviation and bonding members as previously shown in FIG. 1.

Since N-type lead telluride breaks down at high temperatures, it is necessary to segment thermoelement 44 with N-type silicon germanium on the hot side. Where very low temperatures are found at the cold junction, it is desirable to segment the N-type lead telluride of thermoelement 44 with N-type bismuth telluride. In FIG. 2, thermoelement 44 is shown as composed of a segment of N-type silicon germanium 46, a segment of N-type lead telluride 48 and a segment of N-type bismuth telluride 50. Between segment 46 and segment 48 is bonding member 52 composed of tungsten and between segment 48 and segment 50 is a bonding member 54 composed of iron. The lower portion of FIG. 2 is identical to that of FIG. 1. For convenience, however, the parts of FIG. 2 similar to those in FIG. 1 have been identified with the same numerical designations, and reference is made to the description previously given for specific details.

What is claimed is:

1. A thermoelectric couple comprising, (a) first and second semicondctor thermoelements, one of which is doped with P-type impurities and one of which is doped with N-type impurities, said first thermoelement including a semiconductive material which is not sensitive to the environment in which the thermoelectric generator operates, which possesses high tensile strength, and which is easily bondable by metallurgical methods, and (b) encasing means, including said first thermoelement, for isolating said second thermoelement from the environment in which said thermoelectric couple operates, said encasing means further comprising, (1) coupling means, including a heat reception member for receiving heat from a source of heat, for electrically coupling said first thermoelement to said second thermoelement, and (2) output means coupled between said thermoelements and deriving electrical power therefrom, said output means further comprising a first bonding member coupled to said first thermoelement, a first electrical terminal member coupled to said first bonding member, a first electrical insulator coupled to said first electrical terminal member, a second bonding member coupled to said second thermoelement, a stress alleviation member coupled to said second bonding member, a second electrical terminal member coupled to said stress alleviation member and said first electrical insulator, a second electrical insulator coupled to said second electrical terminal member and a heat rejection member coupled to said second electrical insulator, wherein said bonding members, stress alleviation member, and electrical members are thermal and electrical conductors and wherein said electrical insulators are thermal conductors and electrical insulators, the dimensions of said first thermoelement, said second thermoelement, said coupling means and said output means placing said second thermoelement under compression.

2. A thermoelectric couple comprising, (a) first and second semiconductor thermoelements, one of which is doped with P-type impurities and one of which is doped with N-type impurities, said first thermoelement including a semiconductive material which is not sensitive to the environment in which the thermoelectric generator operates, which possesses high tensile strength, and which is easily bondable by metallurgical methods, and (b) encasing means, including said first thermoelement for isolating said second thermoelement from the environment in which said thermoelectric couple operates, said encasing means further comprising, (1) coupling means, including a heat reception member for receiving heat from a source of heat, for electrically coupling said first thermoelement to said second thermoelement, and (2) output means coupled between said thermoelements and deriving electrical power therefrom, said coupling means further comprising a first bonding member coupled to said first thermoelement, a first stress alleviation member coupled between said first bonding member and said heat reception member, a second stress alleviation member coupled to said heat reception member, and a second bonding member coupled between said second stress alleviation member and said second thermoelement, wherein said heat reception member, said bonding members and stress alleviation members are thermal and electrical conductors, the dimensions of said first thermoelement, said second thermoelement, said coupling means and said output means placing said second thermoelement under compression.

3. A thermoelectric couple comprising, (a) first and second semiconductor thermoelements, one of which is doped with P-type impurities and one of which is doped with N-type impurities, said first thermoelement including a semiconductive material which is not sensitive to the environment in which the thermoelectric generator operates, which possesses high tensile strength, and which is easily bondable by metallurgical methods, and (b) encasing means, including said first thermoelement, for isolating said second thermoelement from the environment in which said thermoelectric couple operates, said encasing means further comprising, (1) coupling means, including a heat reception member which is a highly electrical and thermal conducting host semiconductor material doped with P-type impurities for receiving heat from a source of heat, for electrically coupling said first thermoelement to said second thermoelement, and (2) output means coupled between said thermoelements and deriving electrical power therefrom, said host material of said heat reception member comprising silicon molybdenum, the dimensions of said first thermoelement, said second thermoelement, said coupling means and said output means placing said second thermoelement under compression.

4. A thermoelectric couple comprising, (a) first and second semiconductor thermoelements, one of which is doped with P-type impurities and one of which is doped with N-type impurities, said first thermoelement including a semiconductive material which is not sensitive to the environment in which the thermoelectric generator operates, which possesses high tensile strength, and which is easily bondable by metallurgical methods, and (b) encasing means, including said first thermoelement, for isolating said second thermoelement from the environment in which said thermoelectric couple operates, said encasing means further comprising, (1) coupling means, including a heat reception member which is a highly electrical and thermal conducting host semiconductor material doped with P-type impurities for receiving heat from a source of heat and for electrically coupling said first thermoelement to said second thermoelement, and (2) output means coupled between said thermoelements and deriving electrical power therefrom, said heat reception member being bonded directly to said first thermoelement and coupled through a stress relief member and a bonding member to said second thermoelement, the dimensions of said first thermoelement, said second thermoelement, said coupling means and said output means placing said second thermoelement under compression.

References Cited

UNITED STATES PATENTS

| | | | |
|---|---|---|---|
| 2,858,350 | 10/1958 | Fritts et al. | 136—228 |
| 2,952,725 | 9/1960 | Evans et al. | 136—228 |
| 2,972,654 | 2/1961 | Fritts et al. | 136—228 |
| 3,013,097 | 12/1961 | Fritts et al. | 136—228 |
| 3,256,701 | 6/1966 | Henderson | 136—239 X |
| 3,342,567 | 9/1967 | Dingwall | 136—239 X |
| 3,362,853 | 1/1968 | Valdsaar | 136—228 X |

FOREIGN PATENTS

| | | | |
|---|---|---|---|
| 731,826 | 4/1966 | Canada | 136—205 |

CARL D. QUARFORTH, Primary Examiner
H. E. BEHREND, Assistant Examiner

U.S. Cl. X.R.

136—204, 228, 237